(12) United States Patent
Wang et al.

(10) Patent No.: US 8,829,340 B2
(45) Date of Patent: Sep. 9, 2014

(54) SOLAR LIGHT-CONTROL MODULE

(75) Inventors: Wen-Chun Wang, Taichung (TW);
Zhi-Ting Ye, Miao Li County (TW);
Chun-Chia Liu, Taichung County (TW)

(73) Assignees: Wintek Technology(H.K) Ltd.,
Dongguan Songshan Lake SCI & TECH
Industry Park (CN); Wintek Corporation, Taichung (TW)

( * ) Notice: Subject to any disclaimer, the term of this patent is extended or adjusted under 35 U.S.C. 154(b) by 945 days.

(21) Appl. No.: 12/962,351

(22) Filed: Dec. 7, 2010

(65) Prior Publication Data
US 2011/0132458 A1 Jun. 9, 2011

(30) Foreign Application Priority Data

Dec. 9, 2009 (TW) .............................. 98141997 A
Jan. 29, 2010 (TW) .............................. 99102514 A

(51) Int. Cl.
*H01L 31/052* (2014.01)
(52) U.S. Cl.
CPC ........ *H01L 31/0525* (2013.01); *H01L 31/0524* (2013.01); *Y02E 10/52* (2013.01)
USPC .......................................... 136/259; 136/247
(58) Field of Classification Search
USPC ................................................ 136/259, 247
See application file for complete search history.

(56) References Cited

U.S. PATENT DOCUMENTS

| | | | | |
|---|---|---|---|---|
| 4,088,388 A * | 5/1978 | Nakahara et al. | ............. | 385/127 |
| 4,143,234 A * | 3/1979 | Johnson et al. | ............. | 136/259 |
| 4,149,902 A * | 4/1979 | Mauer et al. | ............. | 136/247 |
| 4,155,371 A * | 5/1979 | Wohlmut et al. | ............. | 136/247 |
| 4,169,738 A * | 10/1979 | Luque | ............. | 136/246 |
| 4,210,923 A * | 7/1980 | North et al. | ............. | 257/432 |
| 4,257,676 A * | 3/1981 | Greubel et al. | ............. | 385/142 |
| 4,260,219 A * | 4/1981 | Greubel et al. | ............. | 136/247 |
| 4,264,124 A * | 4/1981 | Greubel et al. | ............. | 385/146 |
| 4,298,802 A * | 11/1981 | Quella et al. | ............. | 250/483.1 |
| 4,352,948 A * | 10/1982 | Kaplow et al. | ............. | 136/249 |
| 4,379,202 A * | 4/1983 | Chalmers | ............. | 136/256 |
| 4,398,056 A * | 8/1983 | Sheng | ............. | 136/259 |
| 4,884,860 A * | 12/1989 | Brown | ............. | 385/27 |
| 5,877,874 A * | 3/1999 | Rosenberg | ............. | 359/15 |
| 6,882,051 B2 * | 4/2005 | Majumdar et al. | ............. | 257/746 |
| 7,047,800 B2 * | 5/2006 | Thiesen et al. | ............. | 73/146 |
| 7,705,523 B2 * | 4/2010 | Wang et al. | ............. | 310/339 |
| 2009/0056791 A1 * | 3/2009 | Pfenninger et al. | ............. | 136/247 |
| 2009/0232509 A1 | 9/2009 | Heikenfeld et al. | | |
| 2010/0139769 A1 * | 6/2010 | Mapel | ............. | 136/259 |

FOREIGN PATENT DOCUMENTS

EP 2 061 093 A1 5/2009

* cited by examiner

*Primary Examiner* — Golam Mowla
(74) *Attorney, Agent, or Firm* — Muncy, Geissler, Olds & Lowe, P.C.

(57) ABSTRACT

A solar light-control module includes a light-propagation chamber, a plurality of micro structures, a refractive media, and at least one solar cell. The light-propagation chamber has a first face, a second face and at least one side surface. Ambient light is incident to the first face to enter the solar light-control module. The micro structures are disposed on the second face to deflect the ambient light and guide the ambient light to a predetermined area of the light-propagation chamber. The refractive media is disposed between the second face of the light-propagation chamber and the micro structures, and the solar cell is disposed on the predetermined area.

10 Claims, 6 Drawing Sheets

16 (14a)

16 (14a)

16 (14a)

16 (14a)

16 (14a)

16 (14a)

SOLAR LIGHT-CONTROL MODULE

BACKGROUND OF THE INVENTION a. Field of the Invention

The invention relates to a solar light-control module.

b. Description of the Related Art

Nowadays, a commercial solar cell is bulky and has low light-collection efficiency (low optical energy received per unit area). Though a Fresnel lens may be installed in a solar cell to condense light and improve the light-collection efficiency as a result, the Fresnel lens must rotate according to the solar azimuth to result in an inconvenient use. Besides, the installation of the Fresnel lens considerably increases the fabrication cost and occupied space of a solar cell module.

BRIEF SUMMARY OF THE INVENTION

The invention provides a solar light-control module having improved light-collection efficiency and low fabrication costs.

According to an embodiment of the invention, a solar light-control module includes a light-propagation chamber, a plurality of micro structures, a refractive media, and at least one solar cell. The light-propagation chamber has a first face, a second face opposite the first face, and at least one side surface connected between the first face and the second face. Ambient light is incident to the first face to enter the solar light-control module. The micro structures are disposed on the second face to deflect the ambient light and guide the ambient light to a predetermined area of the light-propagation chamber. The refractive media is disposed between the second face of the light-propagation chamber and the micro structures, and the index of refraction of the refractive media is larger than the index of refraction of the light-propagation chamber. The solar cell is disposed on the predetermined area.

In one embodiment, the solar light-control module further includes a light-concentrating element disposed on the first face of the light-propagation chamber, and the predetermined area includes at least a part of the side surface.

In one embodiment, the solar light-control module further includes a reflective layer formed on the side surface, and the predetermined area includes a center portion or a periphery portion of the second face.

In one embodiment, the refractive media is a thin film having an index of refraction n in the range of $1 \leq n \leq 3$.

In one embodiment, the solar light-control module further includes an anti-reflection film or a high-refractive-index film formed on the first face.

In one embodiment, the orientations of the micro structures are different to each other.

In one embodiment, the micro structures are bump structures or notch structures.

According to the above embodiments, since the ambient light are deflected by the micro strictures to propagate sideways in the light-propagation chamber, the ambient light are allowed to be concentrated with high intensity on a comparatively small predetermined area instead of spreading over a wide area, and thus the solar cell is allowed to be disposed on the comparatively small predetermined area to effectively reduce the occupied area of the solar cell and enhance the light-collection efficiency.

Other objectives, features and advantages of the invention will be further understood from the further technological features disclosed by the embodiments of the invention wherein there are shown and described preferred embodiments of this invention, simply by way of illustration of modes best suited to carry out the invention.

DETAILED DESCRIPTION OF THE INVENTION

In the following detailed description of the preferred embodiments, reference is made to the accompanying drawings which form a part hereof, and in which are shown by way of illustration specific embodiments in which the invention may be practiced. In this regard, directional terminology, such as "top," "bottom," "front," "back," etc., is used with reference to the orientation of the Figure(s) being described. The components of the present invention can be positioned in a number of different orientations. As such, the directional terminology is used for purposes of illustration and is in no way limiting. On the other hand, the drawings are only schematic and the sizes of components may be exaggerated for clarity. It is to be understood that other embodiments may be utilized and structural changes may be made without departing from the scope of the present invention. Also, it is to be understood that the phraseology and terminology used herein are for the purpose of description and should not be regarded as limiting. The use of "including," "comprising," or "having" and variations thereof herein is meant to encompass the items listed thereafter and equivalents thereof as well as additional items. Unless limited otherwise, the terms "connected," "coupled," and "mounted" and variations thereof herein are used broadly and encompass direct and indirect connections, couplings, and mountings. Similarly, the terms "facing," "faces" and variations thereof herein are used broadly and encompass direct and indirect facing, and "adjacent to" and variations thereof herein are used broadly and encompass directly and indirectly "adjacent to". Therefore, the description of "A" component facing "B" component herein may contain the situations that "A" component directly faces "B" component or one or more additional components are between "A" component and "B" component. Also, the description of "A" component "adjacent to" "B" component herein may contain the situations that "A" component is directly "adjacent to" "B" component or one or more additional components are between "A" component and "B" component. Accordingly, the drawings and descriptions will be regarded as illustrative in nature and not as restrictive.

Figure 1:
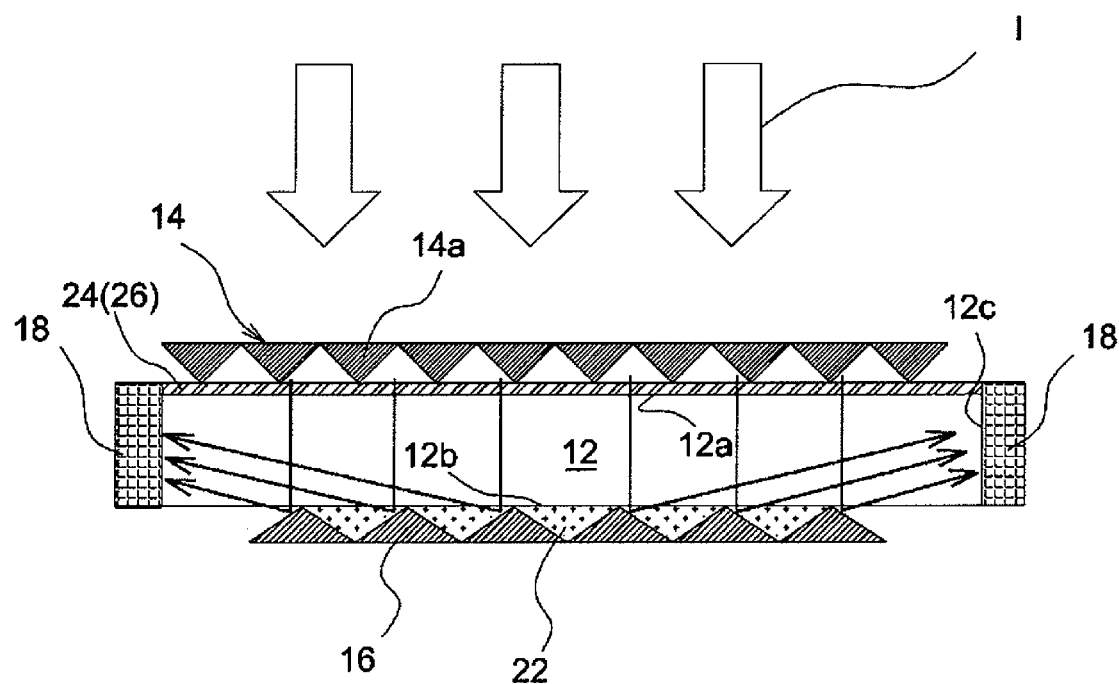
FIG. 1 shows a schematic diagram of a solar light-control module according to an embodiment of the invention.

FIG. 1 shows a schematic diagram of a solar light-control module according to an embodiment of the invention. Referring to FIG. 1, the solar light-control module 10 includes a light-propagation chamber 12, a light-concentrating element 14, and a plurality of micro structures 16. The light-propagation chamber 12 has a top face 12a, a bottom face 12b, and at least one side surface 12c connected between the top face 12a and the bottom face 12b. In this embodiment, the top face 12a is a light incident surface of the solar light-control module 10. Ambient light I is incident to the top face 12a to enter the solar light-control module 10, and the bottom face 12b is opposite the top face 12a. The light-concentrating element 14 is disposed on the top face 12a, and the micro structures 16 are disposed on the bottom face 12b. A solar cell 18 is disposed on the side surface 12c.

When the ambient light I is incident to the solar light-control module 10, the light-concentrating element 14 that may be made of multiple prismatic structures 14a gathers the ambient light I to the light-propagation chamber 12, and the ambient light I are further deflected by the micro structures 16 on the bottom face 12b to be directed towards one side of the light-propagation chamber 12. Finally, the deflected ambient light I is incident to and received by the solar cell 18 on the side surface 12c. In one embodiment, a refractive media 22 may be disposed between the bottom face 12b of the light-propagation chamber 12 and the micro strictures 16. The refractive media 22 may be a thin film coated on the bottom face 12b, and the refractive index of the refractive media 22 is preferably larger than the refractive index of the light-propagation chamber 12. In one embodiment, the refractive media 22 may have an index of refraction n in the range of $1 \leq n \leq 3$. Further, in one embodiment, an anti-reflection film 24 or a high-refractive-index film 26 is formed on the top face 12a of the light-propagation chamber 12 to improve the solar-light utilization efficiency. In this embodiment, the anti-reflection film 24 or the high-refractive-index film 26 is formed between the top face 12a and the light-concentrating element 14.

According to the above embodiment, since the ambient light I are deflected by the micro strictures 16 to propagate sideways in the light-propagation chamber 12, the ambient light I are allowed to be concentrated with high intensity on a comparatively small area like side surface 12c instead of spreading over a wide area, and thus the solar cell 18 is allowed to be disposed on the comparatively small side surface 12c to effectively reduce the occupied area of the solar cell 18 and enhance the light-collection efficiency.

Figure 2:
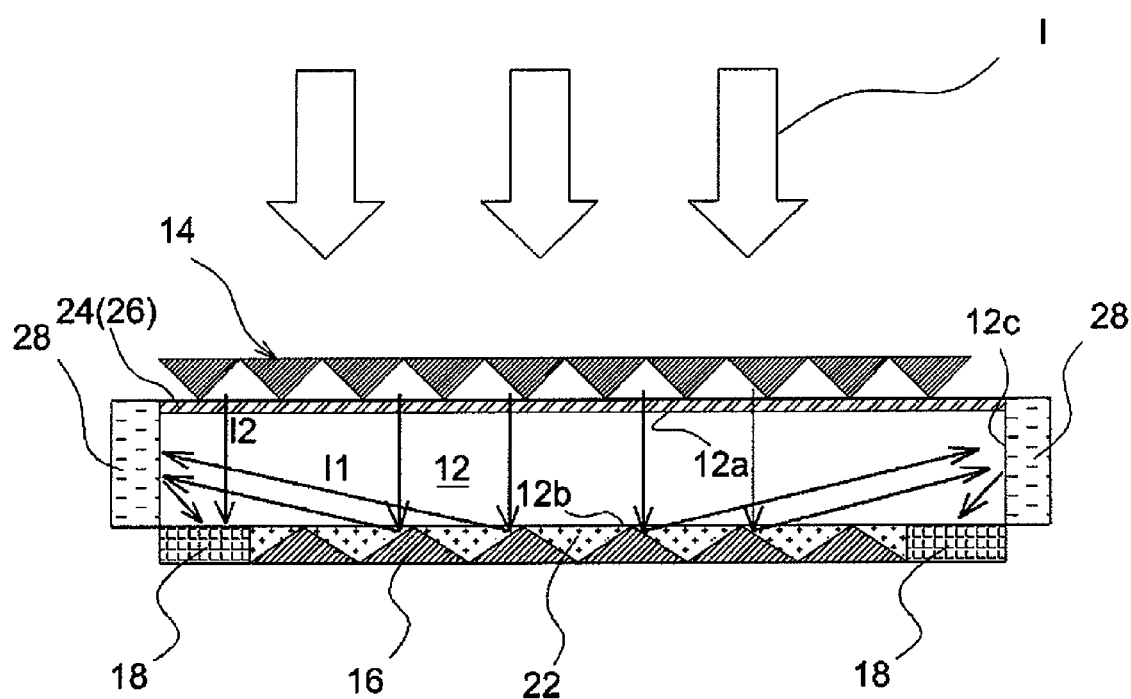
FIG. 2 shows a schematic diagram of a solar light-control module according to another embodiment of the invention.
Figure 3:
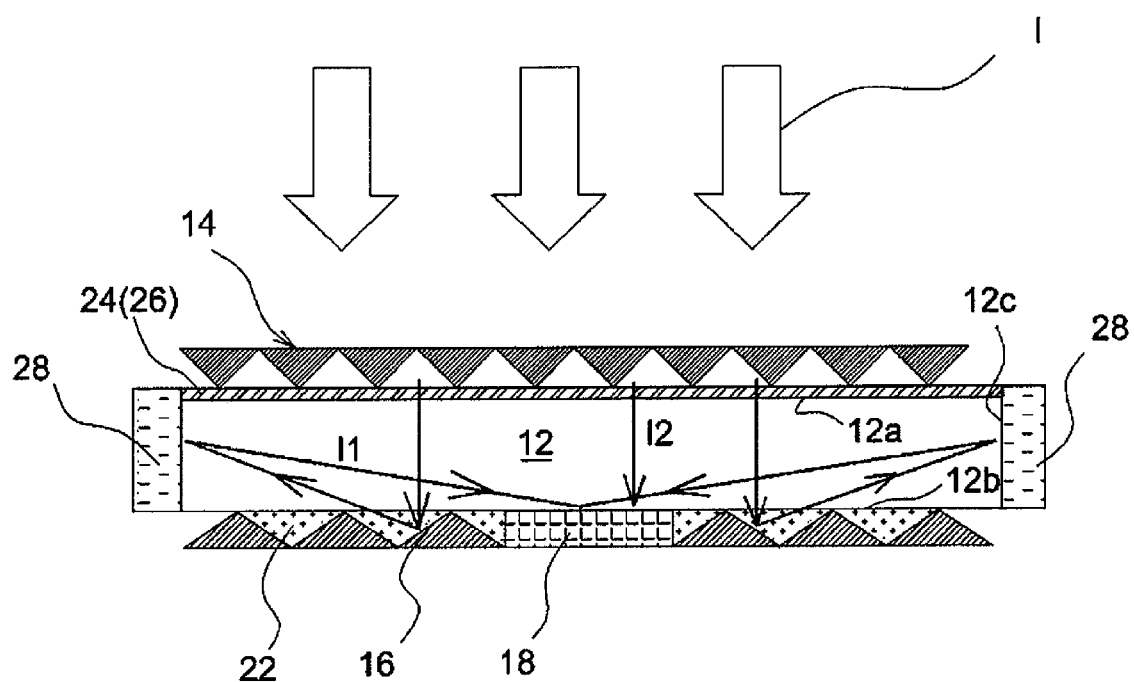
FIG. 3 shows a schematic diagram of a solar light-control module according to another embodiment of the invention.

FIG. 2 shows a schematic diagram of a solar light-control module according to another embodiment of the invention. In a solar light-control module 30 shown in FIG. 2, the solar cell 18 is disposed on the periphery of the bottom face 12b of the light-propagation chamber 12, and the rest of the bottom face 12b are spread with the micro strictures 16. Further, a reflective layer 28 is formed on the side surface 12c. In that case, the ambient light I is deflected towards the side surface 12c by the micro strictures 16, reflected by the reflective layer 28 to be concentrated on the periphery of the bottom face 12b, and finally received by the solar cell 18. Further, except the ambient light I1 deflected by the micro strictures 16, the solar cell 18 on the periphery of the bottom face 12b also receives the ambient light I2 that comes from the top face 12a and is not deflected by the micro strictures 16. Alternatively, in a solar light-control module 40 shown in FIG. 3, the solar cell 18 is disposed on a center portion of the bottom face 12b of the light-propagation chamber 12, and the rest of the bottom face 12b are spread with the micro strictures 16. Further, a reflective layer 28 is formed on the side surface 12c. In that case, the ambient light I is deflected towards the side surface 12c by the micro strictures 16, reflected by the reflective layer 28 to be concentrated on the center portion of the bottom face 12b, and finally received by the solar cell 18. Except the ambient light I1 deflected by the micro strictures 16, the solar cell 18 on the center portion of the bottom face 12b also receives the ambient light I2 that comes from the top face 12a and is not deflected by the micro strictures 16.

According to the above embodiments, the propagation paths of the ambient light I can be changed by adjusting the inclined angle, shape, depth, index of refraction and arrangement of the micro strictures 16 to concentrate the ambient light I on a predetermined area, and the solar cell 18 is disposed on the predetermined area to effectively reduce the occupied area and enhance the light-collection efficiency.

Figure 4A:
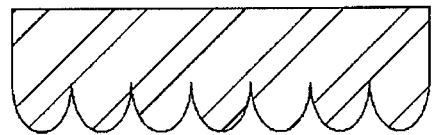
FIG. 4A to FIG. 4D show cross-sections of micro strictures and prismatic structures according to different embodiments of the invention.
Figure 4B:
Figure 4C:
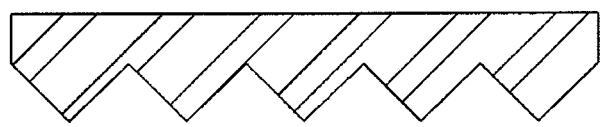
Figure 4D:
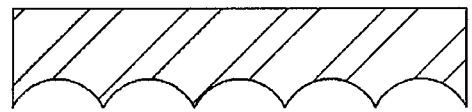
Figure 5A:
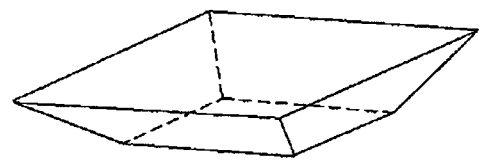
FIGS. 5A and 5B show three-dimensional diagrams of micro strictures and prismatic structures according to different embodiments of the invention.
Figure 5B:
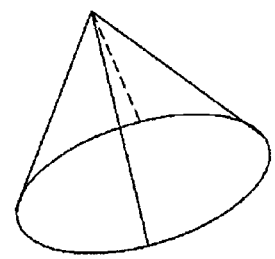
Figure 6:
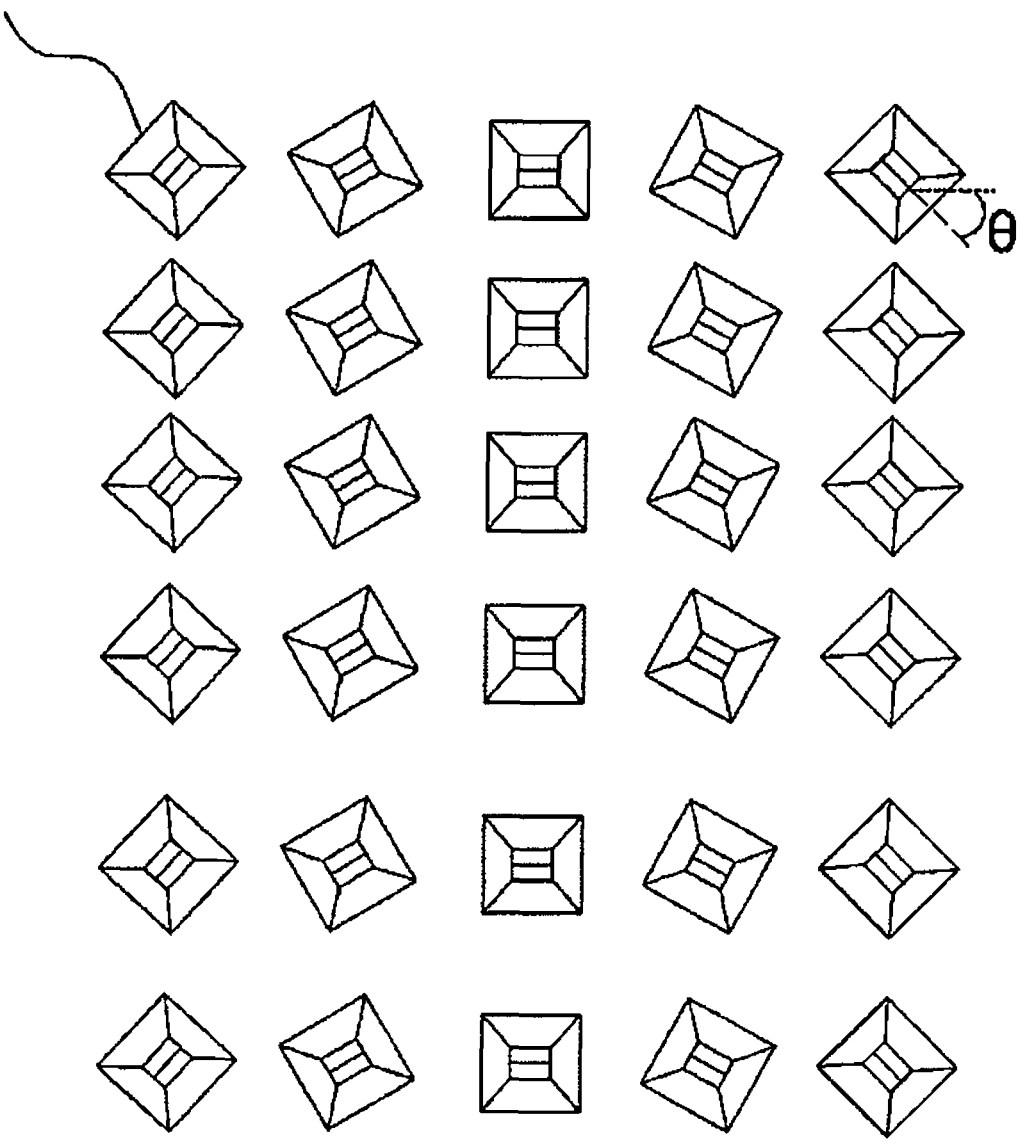
FIG. 6 shows a schematic diagram illustrating an arrangement of micro strictures according to an embodiment of the invention.

Note that a cross-section of the micro stricture 16 and a cross-section of the prismatic structure 14a of the light-concentrating element 14 are not limited in shape. For example, as shown in FIG. 4A to FIG. 4D, the cross-section may be in the shape of a partial ellipse (FIG. 4A), an arc (FIG. 4B), a V-shaped notch (FIG. 4C), and an arc-shaped notch (FIG. 4D). Further, the micro stricture 16 and the prismatic structure 14a may be a bump structure (FIGS. 4A and 4B) or a notch structure (FIGS. 4C and 4D). Besides, the micro stricture 16 and the prismatic structure 14a may have a three-dimensional shape of a pyramid (FIG. 5A) or a cone (FIG. 5B). FIG. 6 shows a schematic diagram illustrating an arrangement of the micro strictures 16. Note that the orientations of the micro strictures 16 are not limited. For example, as shown in FIG. 6, the micro strictures 16 may rotate at different angles θ to allow the orientations of the micro strictures 16 to be different to each other. Further, the micro strictures 16 may be regularly or irregularly disposed and may have various shapes or sizes. In one embodiment, the light-propagation chamber 12 may be made of plastic or glass, and a reflective layer may be additionally formed on a surface of the micro stricture 16 to enhance the effect of light-deflection.

The foregoing description of the preferred embodiments of the invention has been presented for purposes of illustration and description. It is not intended to be exhaustive or to limit the invention to the precise form or to exemplary embodiments disclosed. Accordingly, the foregoing description should be regarded as illustrative rather than restrictive. Obviously, many modifications and variations will be apparent to practitioners skilled in this art. The embodiments are chosen and described in order to best explain the principles of the invention and its best mode practical application, thereby to enable persons skilled in the art to understand the invention for various embodiments and with various modifications as are suited to the particular use or implementation contemplated. It is intended that the scope of the invention be defined by the claims appended hereto and their equivalents in which all terms are meant in their broadest reasonable sense unless otherwise indicated. Therefore, the term "the invention", "the present invention" or the like does not necessarily limit the claim scope to a specific embodiment, and the reference to particularly preferred exemplary embodiments of the invention does not imply a limitation on the invention, and no such limitation is to be inferred. The invention is limited only by the spirit and scope of the appended claims. The abstract of the disclosure is provided to comply with the rules requiring an abstract, which will allow a searcher to quickly ascertain the subject matter of the technical disclosure of any patent issued from this disclosure. It is submitted with the understanding that it will not be used to interpret or limit the scope or meaning of the claims. Any advantages and benefits described may not apply to all embodiments of the invention. It should be appreciated that variations may be made in the embodiments described by persons skilled in the art without departing from the scope of the present invention as defined by the following claims. Moreover, no element and component in the present disclosure is intended to be dedicated to the public regardless of whether the element or component is explicitly recited in the following claims.

What is claimed is:

1. A solar light-control module, comprising:
   a light-propagation chamber having a first face, a second face opposite the first face, and at least one side surface connected between the first face and the second face, wherein ambient light is incident to the first face to enter the solar light-control module;
   a plurality of micro structures disposed on the second face to deflect the ambient light and guide the ambient light to a predetermined area of light-propagation chamber;
   a refractive media disposed between the second face of the light-propagation chamber and the micro structures, wherein the index of refraction of the refractive media is larger than the index of refraction of the light-propagation chamber; and
   at least one solar cell disposed on the predetermined area.

2. The solar light-control module as claimed in claim 1, further comprising a light-concentrating element disposed on the first face of the light-propagation chamber.

3. The solar light-control module as claimed in claim 1, wherein the predetermined area comprises at least a part of the side surface.

4. The solar light-control module as claimed in claim 1, further comprising a reflective layer formed on the side surface, wherein the predetermined area comprises a center portion or a periphery portion of the second face.

5. The solar light-control module as claimed in claim 1, wherein the refractive media is a thin film having an index of refraction n in the range of $1 \leq n \leq 3$.

6. The solar light-control module as claimed in claim 1, further comprising an anti-reflection film or a high-refractive-index film formed on the first face.

7. The solar light-control module as claimed in claim 1, wherein the light-propagation chamber is made of plastic or glass.

8. The solar light-control module as claimed in claim 1, further comprising a reflective layer formed on a surface of each of the micro structures.

9. The solar light-control module as claimed in claim 1, wherein the orientations of the micro structures are different to each other.

10. The solar light-control module as claimed in claim 1, wherein the micro structures are bump structures or notch structures.

* * * * *